United States Patent [19]
Voldman et al.

[11] Patent Number: 5,629,544
[45] Date of Patent: May 13, 1997

[54] SEMICONDUCTOR DIODE WITH SILICIDE FILMS AND TRENCH ISOLATION

[75] Inventors: Steven H. Voldman, Burlington; Minh H. Tong, Essex; Edward J. Nowak, Essex Junction; Stephen F. Geissler, Underhill, all of Vt.

[73] Assignee: International Business Machines Corporation, Armonk, N.Y.

[21] Appl. No.: 428,738

[22] Filed: Apr. 25, 1995

[51] Int. Cl.$^6$ .................................................. H01L 23/62
[52] U.S. Cl. .................... 257/355; 257/356; 257/594; 257/597; 257/601; 257/384
[58] Field of Search ................................ 257/355, 356, 257/357, 510, 594, 597, 601, 384, 358–362

[56] References Cited

U.S. PATENT DOCUMENTS

| | | | |
|---|---|---|---|
| 3,673,428 | 6/1972 | Athanas | 257/355 |
| 3,934,159 | 1/1976 | Nomiya et al. | 317/16 |
| 4,100,561 | 7/1978 | Ollendorf | 257/355 |
| 4,876,584 | 10/1989 | Taylor | 257/355 |
| 4,990,976 | 2/1991 | Hattori | 257/355 |
| 5,060,037 | 10/1991 | Rountree | 257/355 |
| 5,077,591 | 12/1991 | Chen et al. | 257/355 |
| 5,159,518 | 10/1992 | Roy | 257/355 |
| 5,389,811 | 2/1995 | Poucher et al. | 257/357 |
| 5,426,322 | 6/1995 | Shiota | 257/355 |

FOREIGN PATENT DOCUMENTS 1-524864  9/1978  United Kingdom.

OTHER PUBLICATIONS

Voldman et al., "Mixed–Voltage Interface ESD Protection Circuits For Advanced Microprocessors . . . CMOS Technologies", IEEE, 1994.
Journal of Electrostatics 33, (1994), 327–356 Steven H. Voldman, Vaughn P. Gross no month.
"Silicon–on–Insulator (SOI) by Bonding and Etch–Back", Lasky et al., IEDM, Dec. 1985.

*Primary Examiner*—Minh-Loan Tran
*Attorney, Agent, or Firm*—James M. Leas

[57] ABSTRACT

The invention comprises a diode in a well having trench isolation that has an edge. Both the well contact of the diode and the rectifying contact of the diode are silicided, but the silicide on the rectifying contact is spaced from the trench isolation edge. The spacing is provided by a gate stack or other mask. In one embodiment, the gate stack alone spaces the two diode contacts from each other, eliminating the need for trench isolation therebetween. The structure reduces diode series resistance and silicide junction penetration. It significantly improves heat flow in trench isolation technologies, increasing the level of ESD protection. The invention also comprises an SOI diode having a lightly doped region in the thin layer of semiconductor under a gate stack with an ohmic contact to the lightly doped region self-aligned to an edge of the gate stack.

42 Claims, 6 Drawing Sheets

SEMICONDUCTOR DIODE WITH SILICIDE FILMS AND TRENCH ISOLATION

FIELD OF THE INVENTION

This invention generally relates to protection of a semiconductor chip from electrostatic discharge (ESD). More particularly, it relates to a structure for improving device characteristics of protection diodes on chips having trench isolation and silicide contacts. Even more particularly it relates to a gate structure for a diode that reduces diode series resistance and leakage and improves ESD performance.

BACKGROUND OF THE INVENTION

Figure 1A:
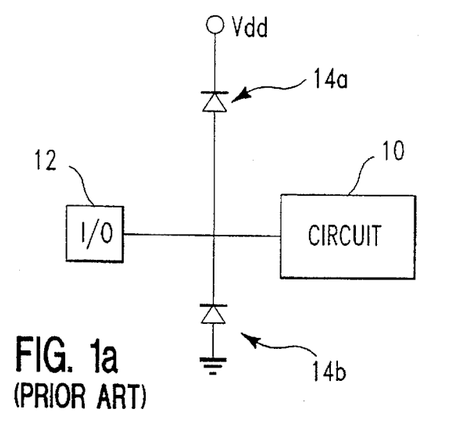
FIGS. 1a–1b are schematic diagrams illustrating protection schemes of the prior art.

FIG. 1 a shows a typical ESD protection scheme for input or output (I/O) circuit 10 on a semiconductor chip. The scheme uses a structure in which I/O pad 12 to the chip is clamped by protection diodes 14a and 14b, one to the power supply and one to the ground. Protection diodes must have electrical characteristics that provide sufficient ESD protection while not degrading chip performance or leakage characteristics. Key parameters include diode series resistance, subthreshold leakage, and reverse leakage.

Figure 2:
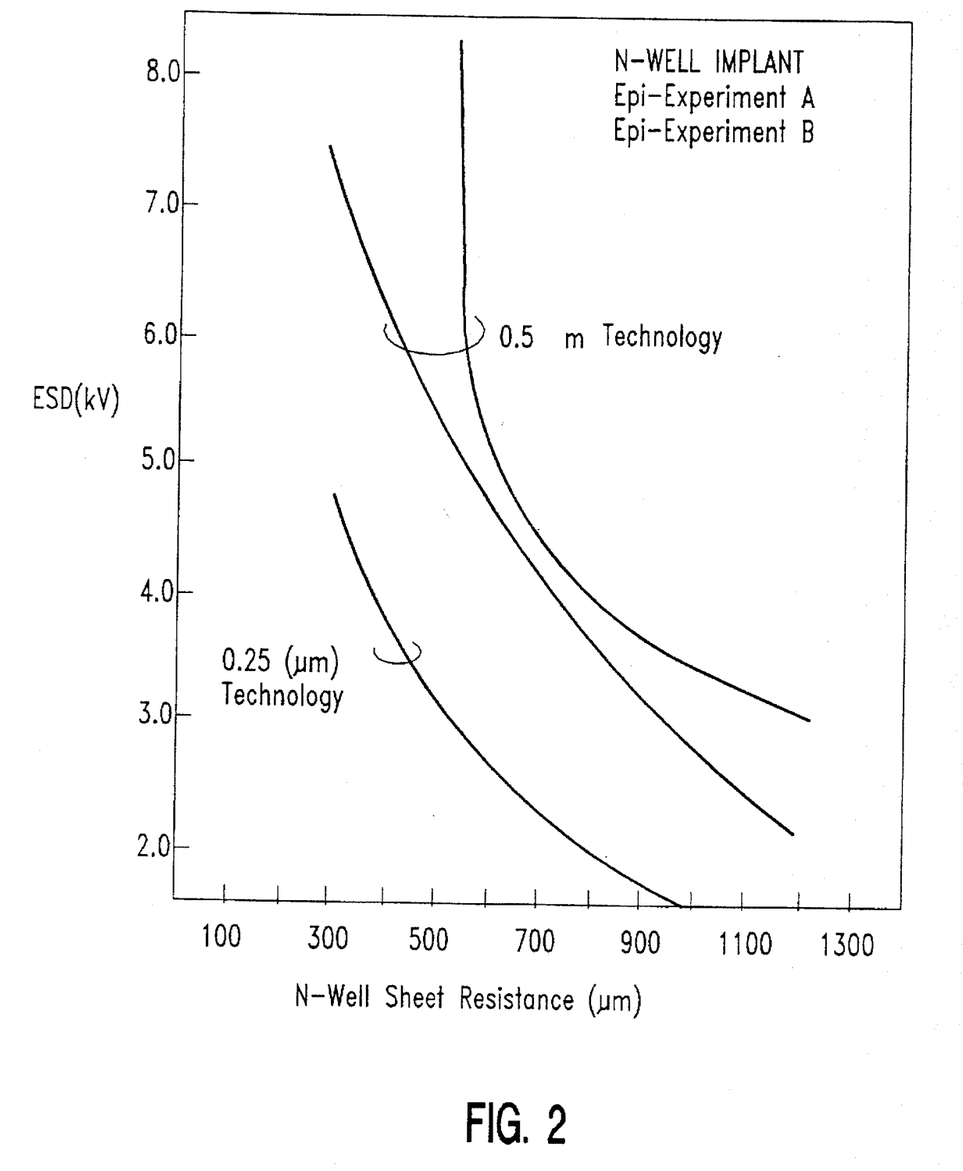
FIG. 2 is a graph illustrating the relationship between ESD protection and diode resistance.

The effect of diode series resistance on ESD performance is illustrated in FIG. 2 and discussed in a paper "Scaling, Optimization and Design Considerations of Electrostatic Discharge Protection Circuits in CMOS Technology," By S. Voldman and V. Gross, published in the *Journal of Electrostatics* volume 33, (1994) page 327–356. It is seen that ESD protection declines as resistance increases.

Figure 1B:
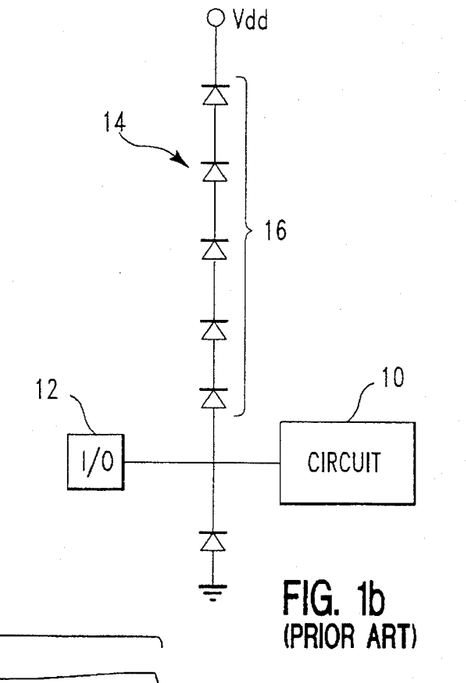

The series resistance characteristic is especially important in a mixed voltage environment (in which a chip operates at a lower voltage than is available on a bus with which it interfaces) because a string of diodes need be used in place of single diode, as illustrated in FIG. 1b. For example, a chip may operate at a Vdd of about 3.2 V while interfacing with a 5 V bus that may apply the 5 V to I/O pad 12. By selecting an appropriate number of diodes in string 16, one can prevent forward biasing and avoid significant diode current from flowing between I/O pad 12 and Vdd during normal operation of the chip, and still provide a current path to Vdd for an ESD transient on I/O pad 12. However, each diode in string of diodes 16 introduces series resistance in the current path and these resistances add to significantly degrade ESD protection.

The amount of ESD protection depends inversely on the total resistance of the diodes in string 16. For example, if I/O pad 12 is zapped positively with respect to Vdd at 3000 V, a peak current of 2 A may flow through string of diodes 16. The actual voltage between I/O pad 12 and Vdd depends on the IR drop across diodes string 16, so the lower the resistance of string 16, the lower the voltage, and the more ESD protection offered.

Figure 1C:
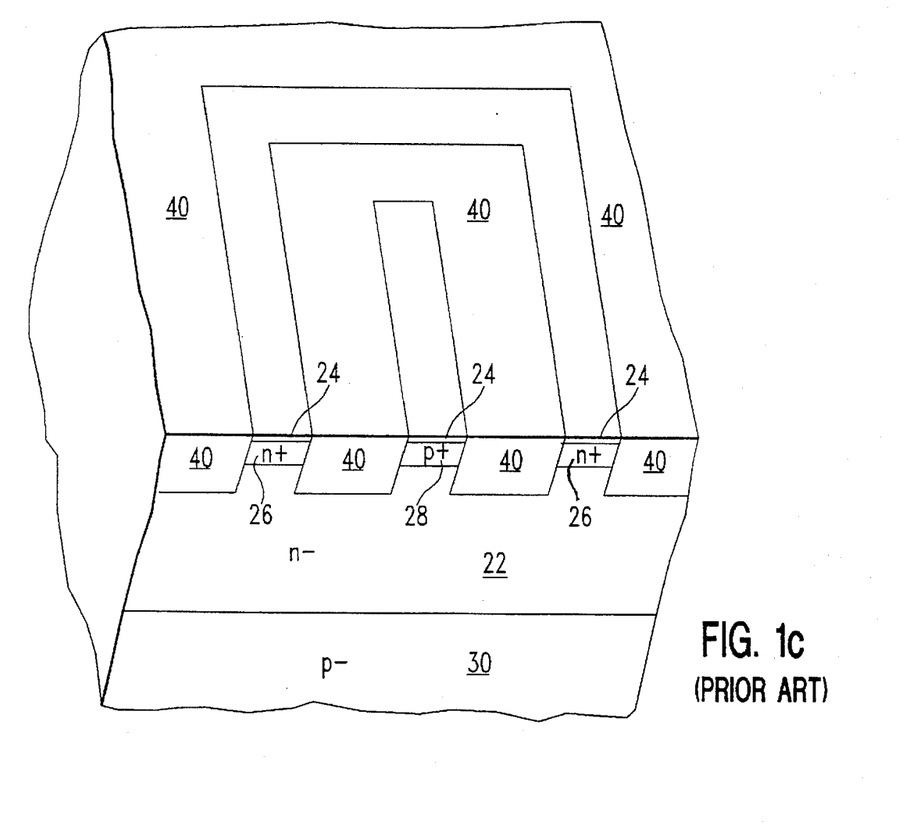
FIGS. 1c is a three-dimensional view showing the structure of a prior art diode.

FIG. 1c shows prior art diode 14 formed on p- substrate 20 in n-well 22. Diode series resistance is largely determined by the size of diode 14, the resistivity of well 22 in which diode 14 is located, the distance current flows in n-well 22 and the depth of the path, and by the resistance of silicide films or contacts 24 to n+ and p+ diffusions 26 and 28. Thus, a wider diode with a lower well resistivity, a shorter current path, and silicided films and contacts provide a lower diode series resistance.

As noted above, silicide films and contacts are known to substantially lower device series resistance. However, in diodes having silicided contacts, diode forward and leakage characteristics, and the amount of ESD protection, have been found to be degraded compared with those not having silicided contacts. In devices without silicide, the rapid increase of resistance with temperature tends to cause current to spread uniformly across the extent of the device, and away from small defects that shunt the junction, and this contributes to preventing damage to the protection diode from a high current ESD pulse. Conversely, in devices with silicide films and contacts, the low resistance path through the silicide across the device permits current through the diode to be far more localized at the defect region, hence damage can occur in silicided devices at lower voltages.

In addition, silicide can be responsible for penetration defects that increase forward and reverse bias device leakage currents. This leakage arises if the metal silicide in any region of the diode extends close to the junction depth. The problem of silicide caused leakage increases as junction depth decreases or penetration depth increases. Thus, not only do silicide films and contacts permit localization of current at a defect, silicide can also cause the defect. With each generation of semiconductor technology junction depth is scaled down so solutions to shorting problems due to silicide penetration are highly desirable.

SUMMARY OF THE INVENTION

It is therefore an object of the present invention to provide a diode having improved device characteristics, including reduced series resistance, higher shunt resistance, and lower leakage with silicided films and contacts.

It is a further object of the present invention to provide a string of diodes linked in series, the string having improved device characteristics.

It is a further object of the present invention to provide silicided diode films and contacts in trench isolation technology with increased space between the silicide and the metallurgical junction edge.

It is a further object of the present invention to provide silicided diode films and contacts in trench isolation technology with improved heat transfer characteristics.

It is a further object of the present invention to provide a diode on an SOI substrate.

It is a feature of the present invention that a gate structure is used as a mask to provide spacing between silicide and trench isolation, eliminating enhanced penetration adjacent trench isolation.

It is a feature of the present invention that each diode of a string of diodes is located in a retrograde doped well to suppress parasitic bipolar action and reduce diode series resistance.

It is an advantage of this invention that the diode structure has a very low series resistance and avoids a silicide penetration mechanism, thereby improving ESD protection and lowering operating current and power consumption.

It is an advantage of the present invention that no additional masks or process steps are needed to form the diodes; only standard masks and steps, already in the process to form CMOS transistors, are used.

It is an advantage of the present invention that the lightly doped side of the diode is formed laterally, and hence diodes are easily formed on SOI substrates without additional masks or process steps.

These and other objects of the invention are accomplished by a semiconductor structure comprising a semiconductor substrate; a semiconductor substrate region in said substrate, said substrate region having a first doping type; a trench isolation located in the substrate region, the trench isolation having an edge; a first heavily doped region of the first doping type located in the substrate region; and a rectifying contact region in the substrate region, the rectifying contact region having a metal silicide therein spaced from the trench isolation edge.

One aspect of the present invention is based on data showing that, while silicide penetration depth across most of the surface of a diode does not extend close to the junction, titanium silicide penetration is significantly greater in the region along a trench isolation edge (as shown in FIG. 1c, STI was used in the prior art to separate the two heavily doped regions of a diode). In a shallow junction technology, the penetration depth along a trench isolation edge was great enough to seriously degrade diode forward and reverse characteristics.

Furthermore, In technologies having n+ and p+ diode contact diffusions 26 and 28 separated by trench isolation 40, the effective path is longer and thinner, and the diode resistance is therefore higher than in technologies using recessed oxide isolation. The difference arises because trench isolation 40 extends deeper into the silicon than does recessed oxide isolation. To overcome this problem, in trench isolation technologies, protection diodes were significantly larger and used up additional chip area to maintain the same level of ESD protection.

Finally, using simulation techniques, applicants showed that (1) there is more current crowding along STI than along LOCOS isolation; (2) the higher current density produces more localized heating with STI than with LOGOS isolation; and (3) STI impedes the lateral flow of heat significantly more than LOCOS isolation (because it extends deeper into the silicon and has more vertical sidewalls). The result was that temperature gradients in the lateral direction and peak temperatures with STI were much larger than with LOCOS isolation. Thus, during an ESD pulse, local temperature rises to a much higher level in STI isolated diodes, and that higher temperature excursion diffuses silicide toward the junction, substantially increasing leakage or even shorting the I/O pad to Vdd.

Applicants found experimentally that the penetration and leakage problems in the protection diode can be substantially reduced by blocking silicide formation adjacent to STI, and that a gate stack over the STI edge provides a suitable means to prevent metal deposition and silicide formation adjacent to STI. The gate stack approach of the present invention is particularly attractive since no process steps beyond those already used for other purposes in chip fabrication are needed for its implementation.

Furthermore, applicants found experimentally that a gate stack can fully substitute for the STI to separate the two diffusions of a diode, and this configuration has the further advantage of substantially shortening and thickening the current path, reducing diode series resistance. By eliminating STI between junctions, this configuration also reduces lateral thermal resistance and peak heating during an ESD pulse. The data shows sharp improvement in the ESD protection level since local heating and silicide migration during an ESD pulse, and device series resistance are all reduced. Finally applicants found that the gate stack structure permits diodes to be easily formed in fully depleted SOI.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Three embodiments of the present invention are presented. In the first, a gate stack separates two oppositely doped regions of each diode of a string of diodes, reducing diode series resistance and eliminating concern about silicide penetration along an STI edge. This embodiment also provides a reduced peak temperature during an ESD pulse. This embodiment is presented both for bulk silicon and SOI. In a second embodiment, the two oppositely doped regions of a diode are separated by both STI and a gate stack in which the gate stack extends over an edge of the STI to prevent metal deposition and silicide formation along that edge. The third embodiment is like the second except that, instead of a gate stack, another mask is used to protect the STI edge from silicide.

Single crystal semiconductor wafers used in the structures illustrated in FIGS. 3–6 are formed from semiconducting materials, such as silicon, germanium, and gallium arsenide. Silicon will be used for illustration below.

FIGS. 3a–3d show steps in the process of fabricating a diode of a string of diodes according to one embodiment of the present invention. STI 40 is formed by standard masking, etch, and deposition steps as described in commonly assigned U.S. Pat. No. 5,173,439, by Dash et at., incorporated herein by reference, and illustrated in FIG. 3a. In brief, to form STI, a pad dielectric is deposited and formed into a mask. A silicon etch is then used in silicon substrate 20 to form shallow trench 42 having nearly vertical 43 edge. Then a passivation oxide is thermally grown along surfaces of the silicon thereby exposed. TEOS is then deposited to fill trench 42. Next, a planarization step is implemented stopping on the nitride pad dielectric which is then removed. The resulting STI 40, like other trench isolation structures, has the nearly vertical edge 43 of trench 42.

Figure 3A:
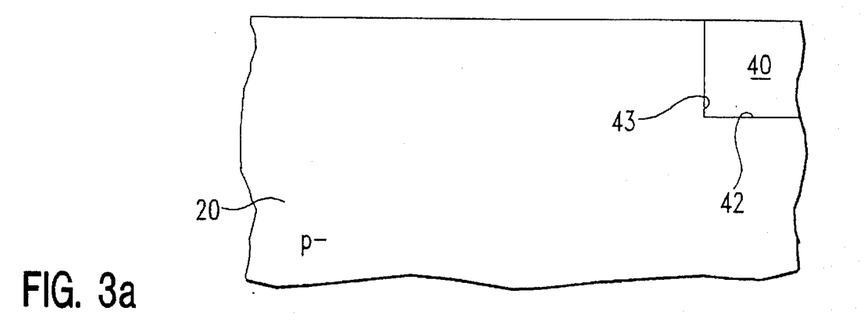
FIGS. 3a–3c are cross sectional views showing the structure at several steps in the process of making the present invention.
Figure 3B:
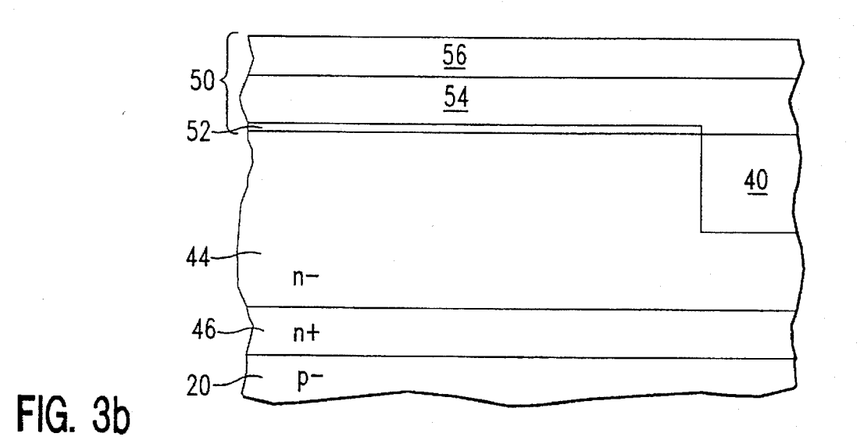

As shown in FIG. 3b, retrograde n-well 44 with heavily doped n+ layer 46 is then formed by standard implant and anneal steps that are well known in the art. Heavily doped layer 46 provides a lower resistance path for current through n-well 44, lowering series resistance. Retrograde well 44 also suppress current gain in the vertical pnp bipolar transistor formed by the p+ region of the diode (see FIG. 3c) together with n-well 44 in which the p+ region resides and p-type substrate 20 in which n-well 44 resides. This gain must remain low in order to prevent parasitic current from being drawn by the protected I/O during normal mixed voltage use: for example, when the input is at 5 V and Vdd is at 3.3 V. Since a chain of diodes (see FIG. 1b) provides a chain of parasitic bipolar transistors, each multiplying the gain of the adjacent transistor, if gain is not sufficiently low the diode chain will draw a very large current during normal operation.

As also shown in FIG. 3b, within each n-well 44, a mask is formed using standard gate stack 50. To form gate stack 50, first, a layer of blanket gate dielectric 52 is thermally grown or deposited. Next a layer of gate conductor 54 is blanket deposited. Gate conductor 54 is next formed of deposited polysilicon. Finally, gate cap dielectric 56 may be deposited on top of gate conductor 54 as needed for FETs otherwise formed on the chip. If insulating cap 56 is used, it is formed by deposition of a material such as blanket $Si_3N_4$.

Figure 3C:
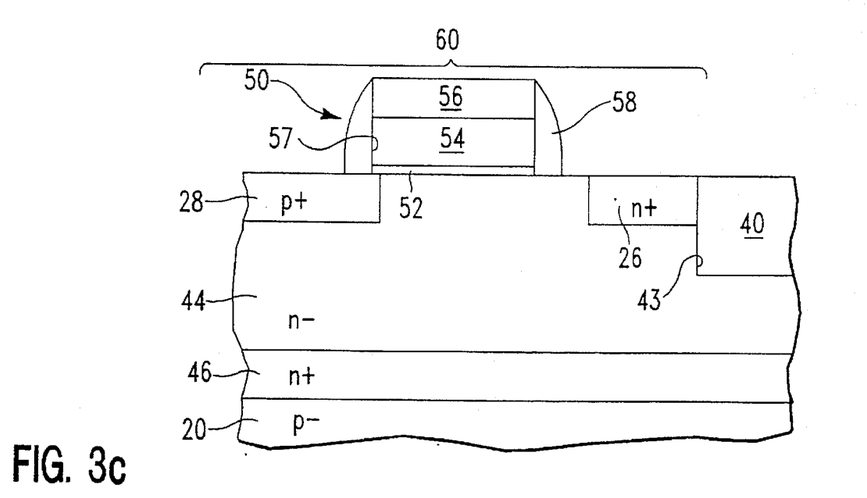

In the next step, illustrated in FIG. 3c, gate stack 50 is defined. If gate cap dielectric 56 is used, photoresist is applied, exposed, and developed, and this pattern is etched in gate cap dielectric 56. The resist may then be stripped, and the pattern in gate cap dielectric 56 is used to continue the etch in gate conductor 54, defining gate stack 50. Otherwise gate conductor 54 is etched with resist in place. Dielectric sidewall spacers 58 are then grown or deposited on the exposed edges of gate stack 50. Spacers 58 are typically formed of a thermally grown oxide along sidewalls 57 of gate conductor 54 and a deposited silicon nitride that is directionally etched to remove nitride along horizontal surfaces while leaving nitride spacers 58 along sidewalls 57. As mentioned above, gate stack 50 formed for diode 60 in n-well 44 has the same structure and is formed in the same process steps used to form gate stacks for transistors elsewhere on the chips. No extra masks or processing steps are needed.

Gate stack 50 serves two purposes: first, gate stack 50 will provide means to separate later formed n+ and p+ doped regions 26 and 28 of diode 60, and second it will provide means to space silicide later deposited on p+ doped region 28 from an STI edge. The use of gate stack 50 as a mask is preferred since gate stacks are otherwise formed on the chip for transistors, and, therefore, no additional process steps are needed. Of course, a mask need not have a conductive member, and alternate materials for the mask are described hereinbelow.

Next, as also illustrated in FIG. 3c, n+ and p+ regions for p and n channel transistors of the chip are provided, and simultaneously, n+ and p+ doped regions 26 and 28 of diode 60 are formed. In one step a standard block mask used to protect n+ regions of n-channel transistors is used to protect n+ region 26 while p+ region 28 is exposed for implant. In another step a second block mask is used to protect p+ region 28 while n+ region 26 is implanted.

These block masks do not necessarily require stringent alignment tolerances or additional surface area since the diffusions or implants for the source/drain regions are self-aligned to gate stack 50 (or to spacers 58 formed along sidewalls 57 of gate stack 50). Thus, the block masks need only have sufficient resolution so that an edge of each mask falls somewhere on gate stack 50.

The block masks each have edges located on gate stack 50 which provides the actual edge to which the implant is aligned. Thus, the two doped regions 26 and 28 have opposite polarity, one on either side of gate stack 50, and each is self-aligned to gate stack 50. Dopant inserted into gate stack 50 itself has been found not to substantially effect performance of diode 60.

Figure 3D:
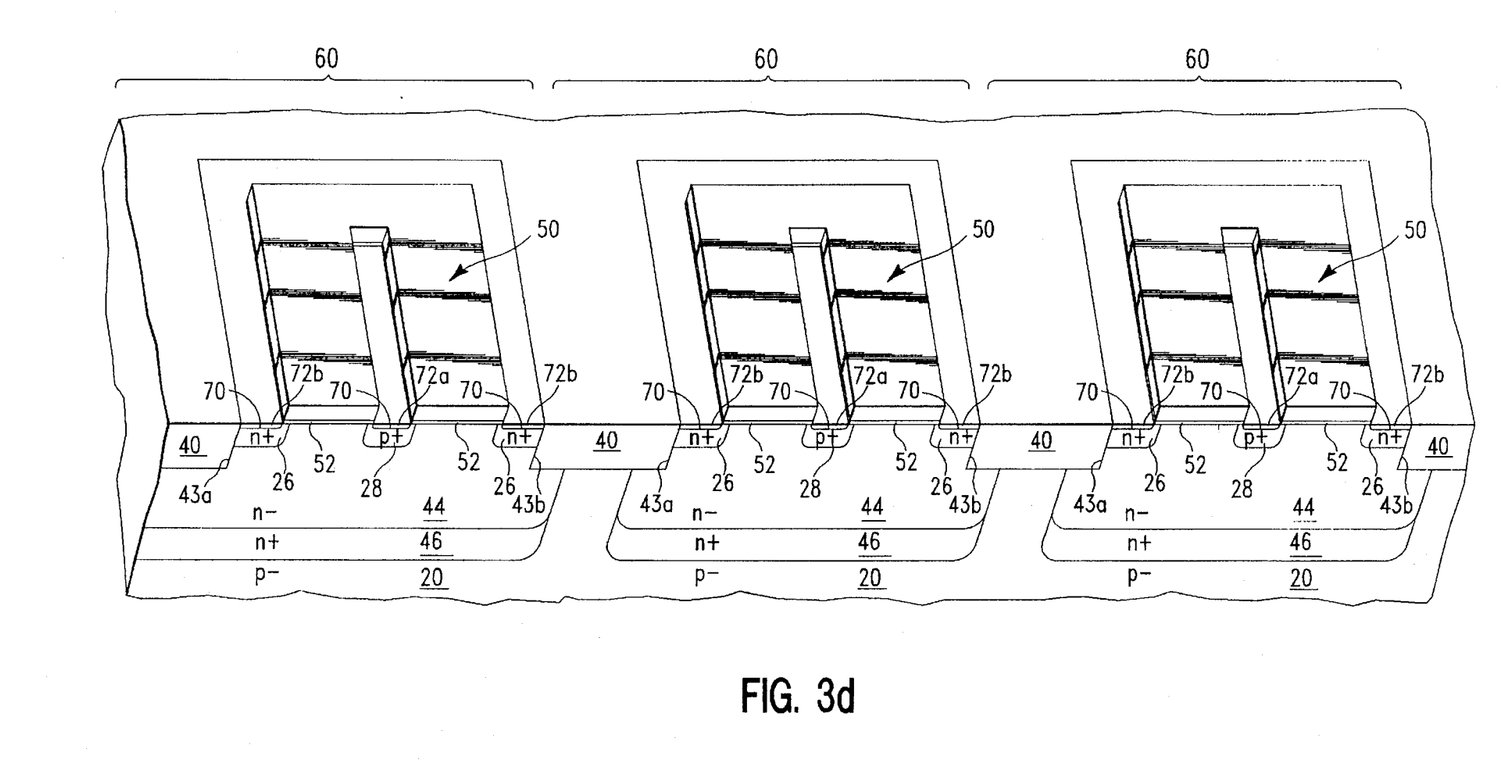
FIGS. 3d is a three-dimensional view showing a plurality of diodes, each in its own n-well, of the present invention in bulk silicon.

Dopant for source/drain regions may also be provided by depositing a doped glass or a doped polysilicon layer after spacers 58 are formed and exposed portions of gate dielectric 52 are removed. After the provision of dopant, wafers are subjected to a high temperature activation, drive-in or diffusion thermal cycle which provides diffusions extending under gate conductor 54. Films and contacts are then silicided to further lower series resistance. A metal, such as titanium, platinum, or cobalt is deposited by a technique such as sputtering or evaporation. The wafer is then heated to a temperature of about 900°–1000° C. so that metal in contact with silicon will react to form metal silicide 70, as shown in FIG. 3d. Unreacted metal, found on surfaces other than silicon, is then chemically removed, leaving silicide 70 in film and contact regions 72a and 72b.

Applicants have found significant improvement in diode series resistance and ESD protection on chips incorporating the structure of the present invention. Gate stack 50 separates n+ diffusion 26 and p+ diffusion 28, providing a shorter path length between diffusions than was available using STI. Also, since silicide 70 on p+ diffusion 28 (the rectifying contact), is separated from STI edges (such as STI edges 43a and 43b), silicide does not penetrate along an STI edge at film and contact region 72a, and diode leakage problems are avoided.

In another embodiment of the invention, the rectifying contact region of the diode is a Schottky barrier diode. One of the above mentioned blocking masks is used to block the p+ implant from this region so that metal silicide 70 contacts the n− silicon of n-well 44 directly, thus forming the Schottky.

Figure 4A:
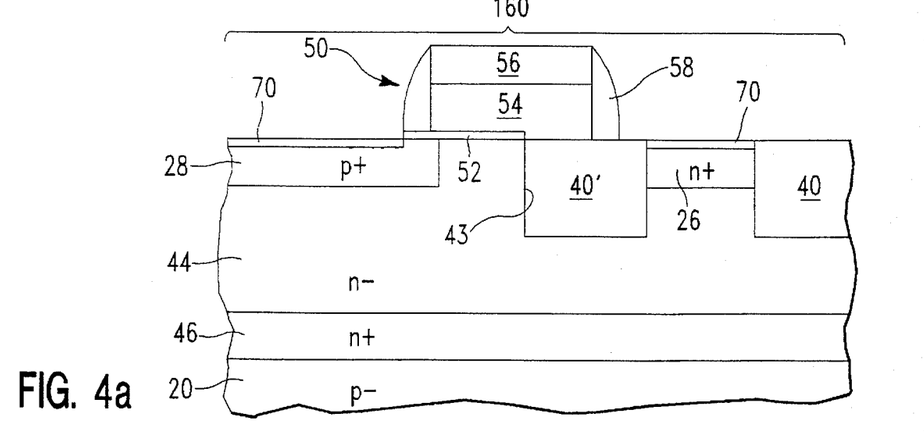
FIGS. 4a–4b are cross sectional views showing alternate embodiments of the present invention.

In another embodiment of the invention, gate stack 50 is used along with STI, as illustrated in FIG. 4a. Gate stack 50 blocks the deposition of metal for silicide 70 over edge 43 of STI 40' adjacent p+ diffusion 28. In this case, the diode is not bordered by STI, and silicide cannot penetrate along STI edge 43 to short the diode.

Figure 4B:
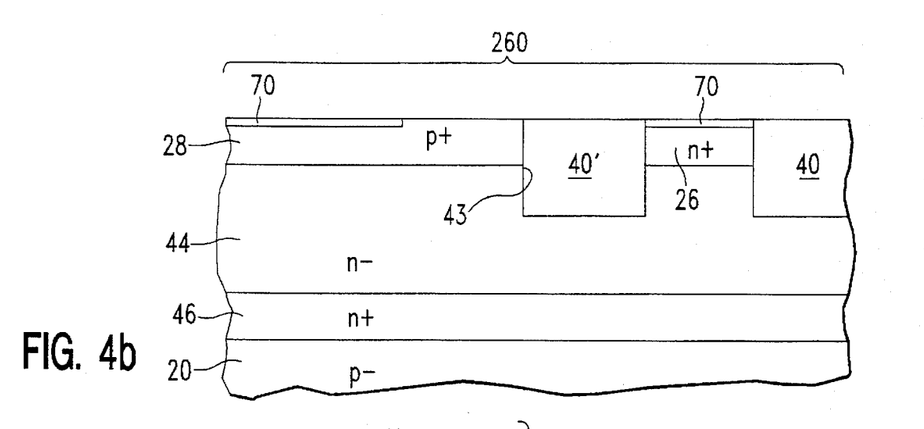

The function of gate stack 50 illustrated in FIG. 4a can also be played by a standard block mask to space metal silicide 70 from edge 43 of STI 40' adjacent p+ diffusion 28 as illustrated in FIG. 4b. Any removable masking material, such as photoresist, plastic, or an inorganic insulator, such as silicon oxide, can be used for blocking the deposition of metal for metal silicide 70 along STI edge 43. In the case illustrated in FIG. 4b, the masking step is provided after the doping step but before metal deposition for silicide 70. The mask can be removed after the metal is deposited, as shown in FIG. 4b. In this case, p+ diffusion 28 of diode 260 extends to STI edge 43 but silicide 70 in the contact is separated from STI edge 43.

Figure 5A:
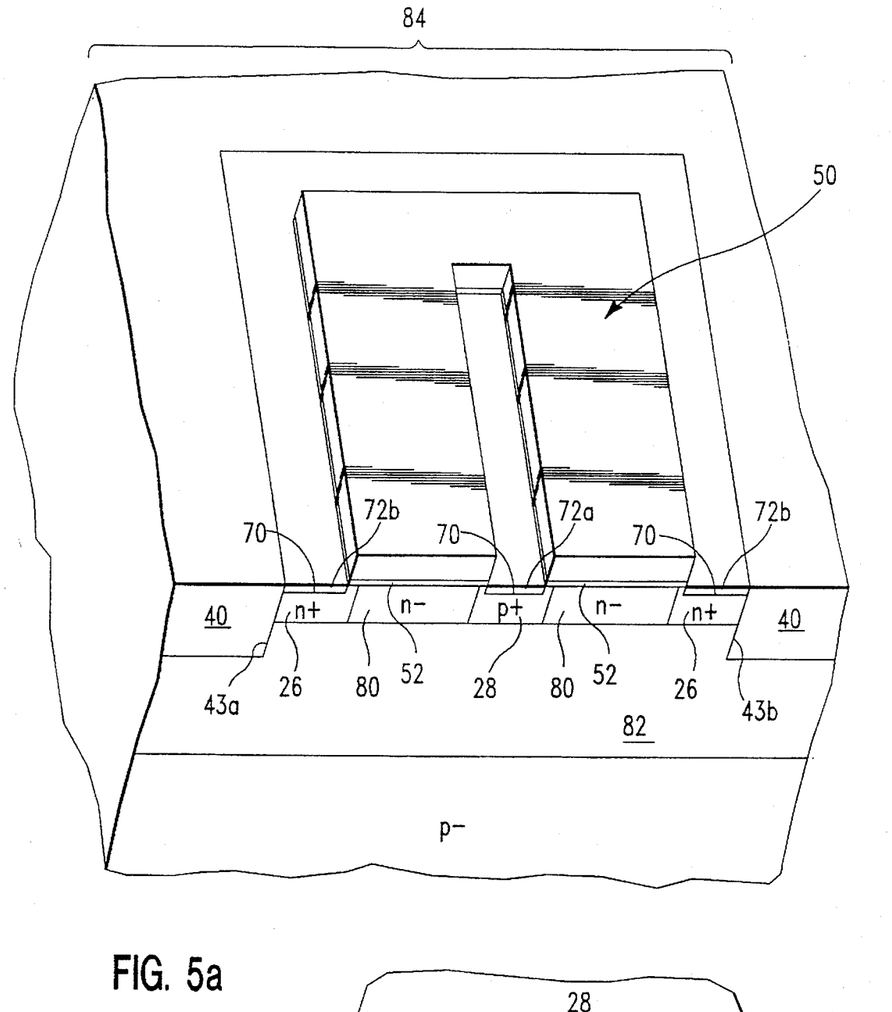
FIGS. 5a is a three-dimensional view showing a diode of the present invention in silicon-on-insulator.

While the present invention provides significant advantages when used in bulk silicon substrates, it is particularly advantageous when used in silicon-on-insulator (SOI) substrates. SOI, particularly fully depleted SOI, requires a substantially different diode structure than that of the prior art, illustrated in FIG. 1c. As shown in FIG. 5a, in fully depleted SOI, silicon layer 80 on insulator 82 is very thin, typically less than 500 nm and frequently in the range of about 5 to 50 nm. p+ diffusion 28 extends all the way through silicon layer 80, and insulator 82, rather than n− well 44, extends beneath diffusion 28. The lightly doped side of diode 84 must, therefore, be formed laterally in the thin silicon layer rather than vertically. Furthermore, since, in fully depleted SOI, ROX or STI would also penetrate through thin silicon layer 80, the use of ROX or STI to separate diode diffusions would isolate one side of diode 84 from the other. The present invention, illustrated in FIG. 5a, provides a structure having a satisfactory n– lightly doped region 80 contacting both p+ and n+ regions of diode 84.

SOI wafers are formed by well known processes, such as that described in an article entitled "Silicon-On-Insulator (SOI) by Bonding and Etch-Back," by J. B. Lasky, et al., presented at the IEDM Conference, December, 1985. To form diode 84 in SOI, process steps similar to those described hereinabove for diode 60 (FIG. 3d) are used, except steps to form retrograde well 46 may be omitted and n-silicon layer 80 takes the place of n-well 44.

Figure 5B:
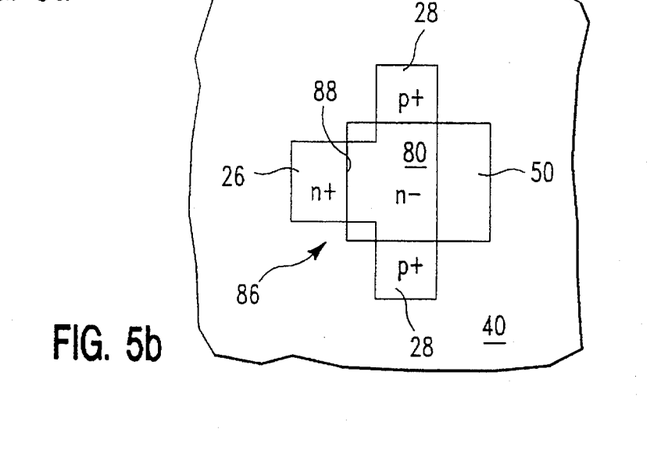
FIG. 5b is a top view illustrating a layout of a semiconductor structure of the present invention.

In FIG. 5a, n+ and p+ regions of diode 84 are formed on opposite sides of gate stack 50. The ohmic and rectifying contacts can also be formed on adjacent sides, or any other edge regions of gate stack 50, so long as the diffusions are sufficiently separated to avoid shorting there between. FIG. 5b shows a layout for structure 86 having a pair of p+ diffusions 28 self-aligned to opposite sides of gate stack 50. n+ diffusion 26 is self-aligned to adjacent edge region 88 of gate stack 50. Structure 86 can be wired as a diode, an FET, or as a lateral bipolar transistor with diffusion 26 providing a self-aligned contact to the n-region of these devices.

Figure 6:
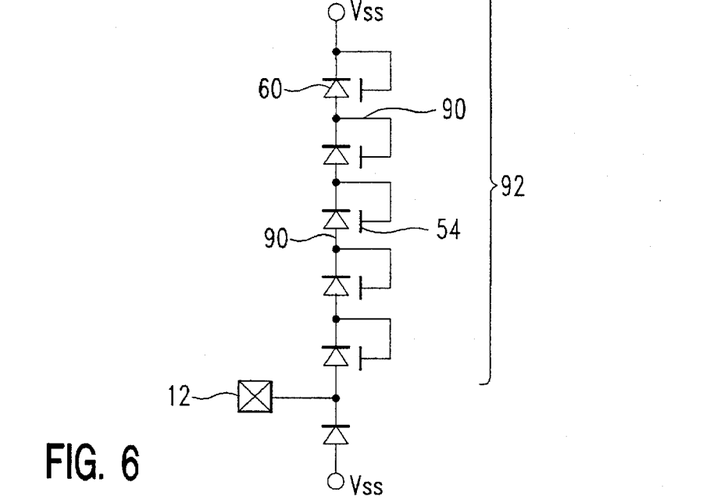
FIG. 6 is a schematic diagram illustrating an interconnection scheme of the present invention.

Once the steps for forming the diodes, each in its own n-well 44, are complete, conductive connectors 90 are formed, as shown in FIG. 6, to interconnect diodes 60 of diode string 92 and connect each end of string 92 with I/O and Vdd conductors. While gate conductor 54 can be left floating, it is best to connect gate conductor 54 to n-well 44 by providing a connection between gate conductor 54 and ohmic contact region 72b (see FIG. 5a). Several other connection schemes for gate conductor 54 are also possible: to n-well 44 through a resistor and to I/O pad 12, for example. Conductive connectors 90 are formed from a highly conductive material, such as doped polysilicon, tungsten, or aluminum.

While several embodiments of the invention, together with modifications thereof, have been described in detail herein and illustrated in the accompanying drawings, it will be evident that various further modifications are possible without departing from the scope of the invention. For example, n and p regions described above can be reversed. Nothing in the above specification is intended to limit the invention more narrowly than the appended claims. The examples given are intended only to be illustrative rather than exclusive.

What is claimed is:

1. A semiconductor diode structure comprising:
   a semiconductor substrate having a surface;
   a semiconductor region extending along said surface, said region having a first doping type;
   a trench isolation having an edge in said region; and
   a diode in said region, said diode comprising a first heavily doped region of said first doping type, said diode further comprising a rectifying contact region, said rectifying contact region having a metal silicide therein, said metal silicide spaced from said trench isolation edge.

2. A semiconductor structure as recited in claim 1, further comprising a mask, said metal silicide self-aligned to said mask.

3. A semiconductor structure as recited in claim 2, wherein said mask comprises a gate stack.

4. A semiconductor structure as recited in claim 3, wherein said first heavily doped region and said rectifying contact are both aligned to said gate stack.

5. A semiconductor structure as recited in claim 4, wherein said gate is connected to said first heavily doped region.

6. A semiconductor structure as recited in claim 3, wherein said first heavily doped region, said rectifying contact region, and said metal silicide are all self-aligned to said gate stack.

7. A semiconductor structure as recited in claim 2, wherein said mask extends over said trench isolation edge.

8. A semiconductor structure as recited in claim 1, wherein said region is a well in said substrate.

9. A semiconductor structure as recited in claim 8, wherein said well is retrograde doped.

10. A semiconductor structure as recited in claim 9, wherein said well is n-type and said substrate is p-type, said structure further comprising a gate stack comprising a polysilicon gate, said metal silicide self-aligned to said gate stack, and said gate being connected to said n-well.

11. A semiconductor structure as recited in claim 1, wherein said trench isolation has a first edge on a first side and a second edge on a second side in said substrate region, said first heavily doped region being on said first side, said rectifying contact region being on said second side, said silicide spaced from said second edge.

12. A semiconductor structure as recited in claim 11, further comprising a mask extending over said second edge.

13. A semiconductor structure as recited in claim 12, wherein said mask comprises a gate stack.

14. A semiconductor structure as recited in claim 11, wherein said second side is opposite said first side.

15. A semiconductor structure as recited in claim 11, said rectifying contact region extending to said trench isolation.

16. A semiconductor structure as recited in claim 11, both said rectifying contact region and said metal silicide aligned to a single mask, both said rectifying contact region and said metal silicide spaced from said second edge.

17. A semiconductor structure as recited in claim 1, wherein said rectifying contact region is a second heavily doped region of a second doping type.

18. A semiconductor structure as recited in claim 17, further comprising a gate stack and a third heavily doped region of the second doping type, said first, second, and third heavily doped regions and said metal silicide being self-aligned to said gate stack.

19. A semiconductor structure as recited in claim 1, wherein said semiconductor substrate comprises a layer of semiconductor on insulator.

20. A semiconductor structure as recited in claim 1, said rectifying contact region and said metal silicide bounded on all sides by said mask.

21. A semiconductor chip, comprising:
    an input pad and a power supply pad to the chip;
    a semiconductor substrate having a surface;
    a plurality of retrograde doped wells on said Surface, said wells having a first doping type;
    a trench isolation having an edge in each said well;
    a diode in each said well, said diode comprising a first heavily doped region of said first doping type and a rectifying contact region having a metal silicide therein, said metal silicide spaced from said trench isolation edge; and
    a plurality of said diodes being interconnected to form a chain of diodes in series, said chain having a first end and a second end, said first end connected to said input pad, said second end connected to said power supply pad.

22. A semiconductor chip as recited in claim 21, said chip further comprising a first conductor receiving a first voltage when in normal operation, said chip operating at a second voltage less than said first voltage when said chip is operational, said chip having a second conductor at said second voltage when said chip is operational, said first end tied to said first conductor and said second end tied to said second conductor.

23. A semiconductor chip as recited in claim 22, wherein said first conductor is an I/O of said chip and said second conductor is at Vdd when said chip is operational.

24. A semiconductor structure comprising:
   a semiconductor substrate comprising a layer of semiconductor on an insulator, said layer of semiconductor having a surface;
   a semiconductor region extending along said surface, said semiconductor region bounded by isolation on at least one side, said isolation having an edge;
   a mask on said semiconductor region, said mask having a first edge region and a second edge region;
   a lightly doped region of a first conductivity type in said layer of semiconductor under said mask;
   a first heavily doped region of a first doping type extending completely through said layer, said first heavily doped region contacting said lightly doped region, said first heavily doped region self-aligned to said first edge region; and
   a rectifying contact region contacting said lightly doped region, said rectifying contact region self-aligned to said second edge region.

25. A semiconductor structure as recited in claim 24, wherein said rectifying contact region is a second heavily doped region of a second doping type.

26. A semiconductor structure as recited in claim 25, wherein said mask comprises a third edge region, and further comprising a third heavily doped region of the second doping type self-aligned to said third edge region.

27. A semiconductor structure as recited in claim 24, wherein said first edge region and said second edge region are located on adjacent sides of said mask.

28. A semiconductor structure as recited in claim 24, wherein said first heavily doped region and said rectifying contact region further comprise a metal silicide.

29. A semiconductor structure as recited in claim 24, further comprising isolation extending to said insulator.

30. A semiconductor structure as recited in claim 29, wherein said isolation is trench isolation.

31. A semiconductor structure as recited in claim 24, wherein said mask comprises a gate stack.

32. A semiconductor diode comprising:
   a semiconductor substrate comprising a layer of semiconductor on an insulator, said layer of semiconductor having a surface;
   a trench isolation having a trench isolation edge;
   a semiconductor region extending along said surface, said semiconductor region bounded by isolation on at least one side; and
   a diode in said semiconductor region, said diode comprising a first heavily doped region of a first doping type, said diode further comprising a rectifying contact region, said rectifying contact region having a metal silicide therein, said metal silicide spaced from said trench isolation edge.

33. A semiconductor structure as recited in claim 32, further comprising a mask on said semiconductor region, said mask having a first edge region and a second edge region.

34. A semiconductor structure as recited in claim 33, further comprising:
   a lightly doped region of a first conductivity type in said layer of semiconductor under said mask, said first heavily doped region contacting said lightly doped region, said first heavily doped region self-aligned to said first edge region; and
   said rectifying contact region contacting said lightly doped region, said rectifying contact region and said metal silicide self-aligned to said second edge region.

35. A semiconductor structure as recited in claim 33, wherein said mask comprises a gate stack.

36. A semiconductor structure as recited in claim 33, said second edge region being opposite said first edge region being opposite said first edge region.

37. A semiconductor structure as recited in claim 32, wherein said rectifying contact region is a second heavily doped region of a second doping type.

38. A semiconductor structure as recited in claim 37, further comprising a gate stack and a third heavily doped region of the second doping type, said first, second, and third heavily doped regions and said metal silicide being self-aligned to said gate stack.

39. A semiconductor structure comprising:
   a semiconductor substrate comprising trench isolation;
   a gate stack extending over said substrate; and
   a rectifying contact in said substrate self-aligned to said gate stack, said rectifying contact having a metal silicide therein, said metal silicide spaced from said trench isolation.

40. A structure as recited in claim 39, wherein said rectifying contact is an electrode of one of a field effect transistor, a diode, and a lateral bipolar transistor.

41. A structure as recited in claim 40, wherein said substrate comprises semiconductor-on-insulator.

42. A structure as recited in claim 40, wherein said gate stack overlaps said trench isolation and spaces said metal silicide from said trench isolation.

* * * * *